United States Patent
Ke et al.

(10) Patent No.: US 7,538,398 B2
(45) Date of Patent: May 26, 2009

(54) SYSTEM AND METHOD FOR FORMING A SEMICONDUCTOR DEVICE SOURCE/DRAIN CONTACT

(75) Inventors: Chung-Hu Ke, Taipei (TW); Ching-Ya Wang, Taipei (TW); Wen-Chin Lee, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/766,773

(22) Filed: Jun. 21, 2007

(65) Prior Publication Data

US 2008/0315321 A1    Dec. 25, 2008

(51) Int. Cl.
 *H01L 29/417* (2006.01)
(52) U.S. Cl. ............... 257/382; 257/383; 257/249; 257/E29.116
(58) Field of Classification Search .......... 257/382, 257/383, 249, E29.116
 See application file for complete search history.

(56) References Cited

U.S. PATENT DOCUMENTS

| | | | | |
|---|---|---|---|---|
| 6,429,493 | B1* | 8/2002 | Asahina et al. | 257/382 |
| 7,061,111 | B2 | 6/2006 | MeTeer | 257/751 |
| 7,122,878 | B2 | 10/2006 | Huang et al. | 257/532 |
| 7,268,073 | B2* | 9/2007 | Ramappa et al. | 438/652 |
| 2007/0032062 | A1 | 2/2007 | Lee et al. | 438/597 |
| 2008/0042291 | A1* | 2/2008 | Knarr et al. | 257/762 |

OTHER PUBLICATIONS

Arnal, V. et al., "45 nm Node Multi Level Internconnects with Porous SiOCH Dielectric K=2.5", Interconnect Technology Conference, 2006 International (Jun. 5-7, 2006), pp. 213-215.
Demuynck, S. et al, "Impact of Cu contacts on front-end performance: a projection towards 22nm node", Interconnect Technology Conference, 2006 International (Jun 5-7, 2006), pp. 178-180.
Itabashi, T. et al, "Electroless deposited CoWB for copper diffusion barrier metal", Interconnect Technology Conference, 2002, Proceedings of the IEEE 2002 International (2002) pp. 285-287.
Li, C.Y. et al., "Barrier-free direct-contact-via (DCV) structures for copperinterconnects", Electronics Letters, vol. 38, Issue 18, (Aug. 29, 2002) pp. 1026-1028.
Topol, A. et al., "Lower Resistance Scaled Metal Contacts to Silicide for Advanced CMOS", VLSI Technology, Digest of Technical Papers, Symposium on, (Jun. 13-15, 2006), S. Cohen—L. Deligianni.

* cited by examiner

*Primary Examiner*—Victor A Mandala
(74) *Attorney, Agent, or Firm*—K & L Gates LLP

(57) ABSTRACT

The present invention discloses a semiconductor source/drain contact structure, which comprises a substrate, a source/drain region disposed in the substrate, at least one non-silicided conductive layer including a barrier layer disposed over and in contact with the source/drain region, and one or more contact hole filling metals disposed over and in contact with the at least one non-silicided conductive layer, wherein a first contact area between the at least one non-silicided conductive layer and the source/drain region is substantially larger than a second contact area between the one or more contact hole filling metals and the at least one non-silicided conductive layer.

14 Claims, 4 Drawing Sheets

SYSTEM AND METHOD FOR FORMING A SEMICONDUCTOR DEVICE SOURCE/DRAIN CONTACT

BACKGROUND

The present invention relates generally to semiconductor processes, and more particularly to device source/ drain contact structure.

A key challenge for high performance CMOS devices is the external parasitic resistance. Up till now, resistances from some resistive components, such as a contact with a tungsten (W) plug are not playing a critical role but will become a growing issue as plug resistance rapidly climbs in the coming generations. If not resolved, this resistance increase may approach or even exceed junction extension resistance in value. Introducing Cu at the contact level was presented as a possible solution to retard the parasitic effects on transistor drive current and circuit delay caused by increased resistance of the contact with the W plug upon scaling.

However, based on an earlier study by S. Demuynck, replacing the W-fill material by Cu does not result in a significant contact resistance reduction. The reason is that even though the Cu resistance is low, a significant portion of the overall contact resistance comes from a barrier metal, which is still made of the high resistance W.

Barrier-free direct-contact-via (DCV) structures, which has been widely used for copper interconnects between two metal layers. However such structures cannot be used for a so called "first contact layer" that makes connections between Metal 1 and transistors, because the Cu will diffuse through a silicide layer and will lead to significant yield loss.

As such, what is desired is a new contact structure that has a lower contact resistance.

SUMMARY

In view of the foregoing, the present invention discloses a source/drain contact structure having an enlarged contact area between a barrier layer and the underlying source/drain region. Through this enlarged contact area, the barrier layer contact resistance is reduced, thus the total contact resistance is also reduced.

In one aspect of the present invention, the source/drain contact structure comprises a substrate, a source/drain region disposed in the substrate, at least one non-silicided conductive layer including a barrier layer disposed over and in contact with the source/drain region, and one or more contact hole filling metals disposed over and in contact with the at least one non-silicided conductive layer, wherein a first contact area between the at least one non-silicided conductive layer and the source/drain region is substantially larger than a second contact area between the one or more contact hole filling metals and the at least one non-silicided conductive layer.

In another aspect of the present invention, the source/drain contact structure is formed by depositing a first barrier layer over the source/drain region prior to an inter-metal-dielectric layer deposition, depositing the inter-metal-dielectric layer, etching one or more contact holes in the inter-metal-dielectric layer, and depositing a filling metal in the one or more contact holes.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of forming a novel source/drain contact structure with low contact resistance. The description includes exemplary embodiments, not excluding other embodiments, and changes may be made to the embodiments described without departing from the spirit and scope of the invention. The following detailed description does not limit the invention. Instead, the scope of the invention is defined by the appended claims.

Figure 1:
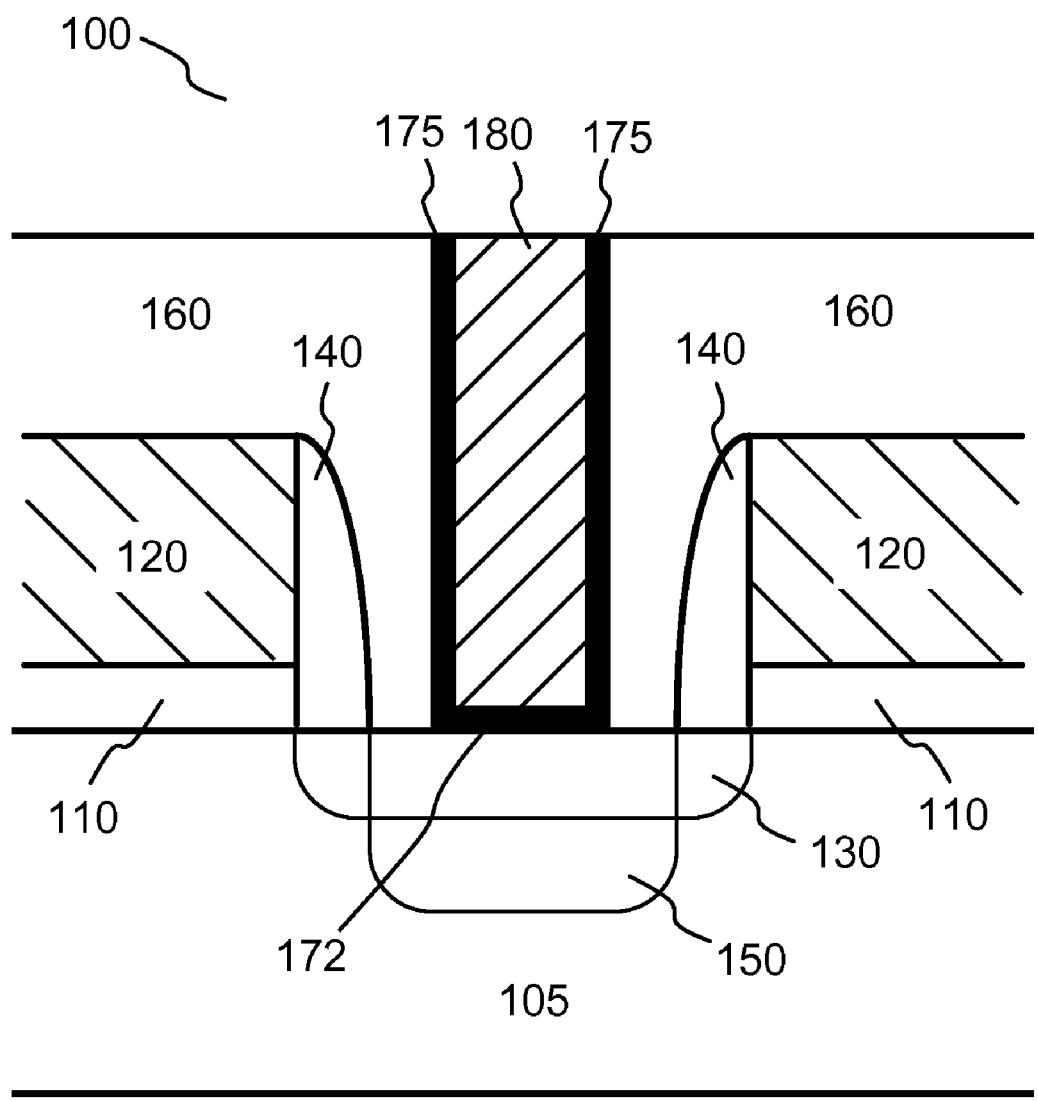
FIG. 1 is a cross-sectional view of a conventional transistor source/drain contact.

FIG. 1 is a cross-sectional view 100 of a conventional transistor source/drain contact structure. Modern transistors are formed in a substrate 105 and isolated from each other by shallow trench isolation (STI). The substrate 105 is preferably made of bulk silicon, but other commonly used materials and structures such as SiGe, silicon on insulator (SOI), SiGe on insulator, and strained silicon on insulator can also be used. A gate stack including a gate dielectric 110 and a gate electrode 120 is formed in one of the transistors. Lightly doped drain/source (LDD) regions 130 are then formed by implanting impurities such as boron or phosphor into the substrate 105. Then spacers 140 are formed on the sidewalls of gate electrode 120. As is known in the art, the formation of spacers 140 preferably includes forming one or more dielectric layer(s) and etching the dielectric layer(s). The remaining portion of the dielectric layer(s) becomes the spacers 140. The formation of the dielectric layer(s) includes commonly used techniques, such as plasma enhanced chemical vapor deposition (PECVD), low-pressure chemical vapor deposition (LPCVD), sub-atmospheric chemical vapor deposition (SACVD), and the like. The spacers 140 may comprise a single layer (silicon nitride or SiON layer) or more than one layer, such as a silicon nitride or SiON layer on a silicon oxide layer. After the spacer formation, implanting impurities into semiconductor substrate forms a source/drain region 150. Then the source/drain region is silicided by annealing a deposited metal. Source/drain electrode are subsequently formed on the source/drain region 150 by making a contact thereon.

Referring again to FIG. 1, the conventional source/drain contact is formed by etching a contact hole in a inter-metal-dielectric 160, depositing a barrier layer 175 on the sidewalls and bottom 172 of the contact hole, and filling the contact hole with a metal 180. The convention source/drain contact has a barrier-layer-to-silicide area just the size of the bottom 172 of the contact hole. A total contact resistance Rc may be expressed by the following equation:

$$Rc = (1/R1 + 1/R2)^{-1} + R3 \qquad \text{(EQ. 1)}$$

where R1 represents a filling metal resistance, R2 represents a resistance of the barrier layer on the sidewalls of the contact hole, and R3 represents a resistance of the barrier layer on the bottom of the contact hole. Since the barrier layer typically has high resistance, even though conventional contact structure employs various methods to reduce R1, the total contact resistance Rc is still high due to the high R3. The present invention discloses a novel source/drain contact structure and methods for making the same. The novel source/drain contact structure can reduce R3 in EQ. 1.

Figure 2A:
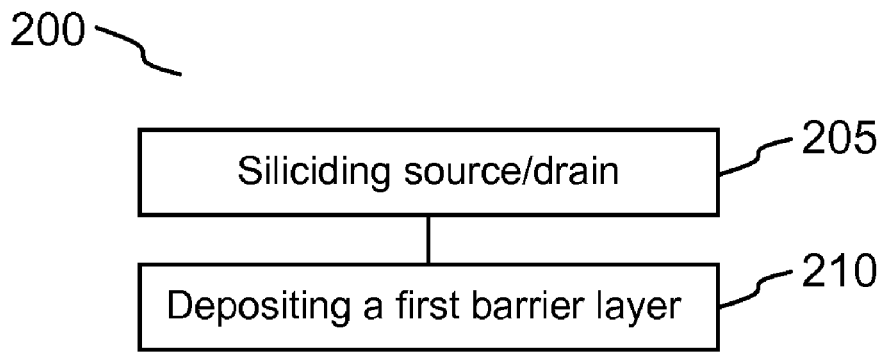
FIGS. 2A and 2B are flowcharts illustrating beginning process steps for forming a source/drain contact according to embodiments of the present invention.
Figure 2B:
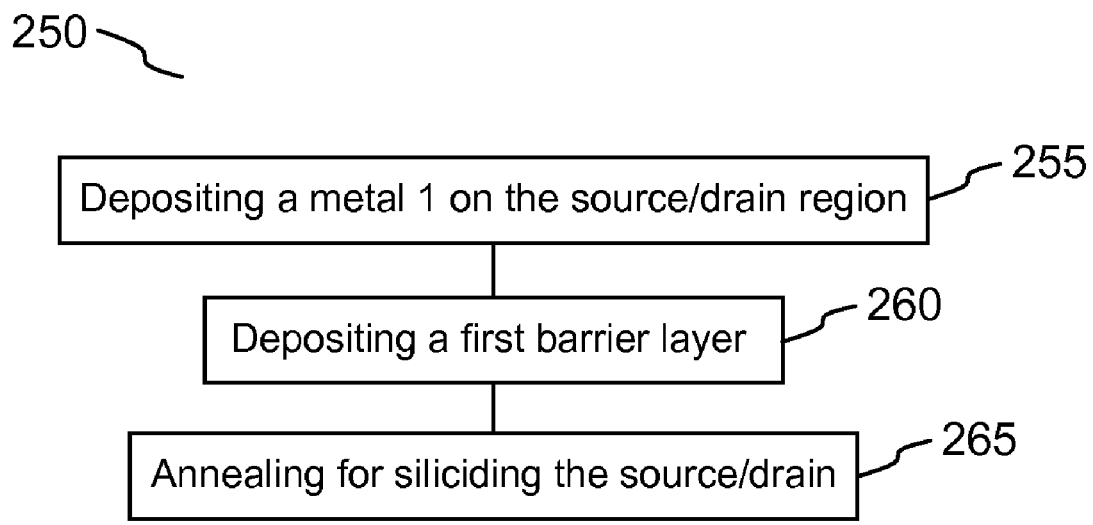

FIGS. 2A and 2B are flowcharts 200 and 250 illustrating beginning process steps for forming the novel source/drain contact structure according to embodiments of the present invention. Referring to flowchart 200 of FIG. 2A, after forming the source/drain region 150 in the substrate 105 as shown in FIG. 1, the contact forming process begins with a siliciding source/drain step 205. First, a metal layer is blanket is deposited. The metal layer preferably includes metals that will have a low or middle barrier height with the underlying semiconductor material, such as cobalt, nickel, tantalum, tungsten, and combinations thereof. The device is then annealed to form a silicide between the deposited metal layer and the underlying source/drain region 150. Un-reacted metal is then removed. It is to be realized that if germanium is present in the source/drain region 150, germano-silicide will be formed. Throughout the description, the term "silicide" also includes germano-silicide, as well as other materials known to people having skills in the art.

After the source/drain silicidation step 205, a first barrier layer deposition step 210 is performed. According to a first embodiment of the present invention, the first barrier layer is deposited by selective electroless plating of a metal, such as CoWP, CoWB, Ta/TaN, Ru or Fe, on the source/drain silicided area. According to a second embodiment of the present invention, the first barrier layer is made of a selective epitaxy growth barrier layer (Co, CoSi). According to a third embodiment of the present invention, the first barrier layer is formed by atomic layer deposition of materials, such as Ru.

Referring to flowchart 250 of FIG. 2B, according to a fourth embodiment of the present invention, the contact formation process may begin with a metal 1 deposition step 255. Typically, metal 1 is used for first metal connection layer. Here the metal 1 is selectively deposited on the source/drain region 150. The metal 1 preferably includes metals that will have a low or middle barrier height with the underlying semiconductor material, such as cobalt, nickel, tantalum, tungsten, and combinations thereof. A first barrier layer (TiN) is selectively deposited on the metal 1 in step 260. The device is then annealed in step 265 to form a silicide between the metal 1 layer and the underlying source/drain region 150.

Figure 3:
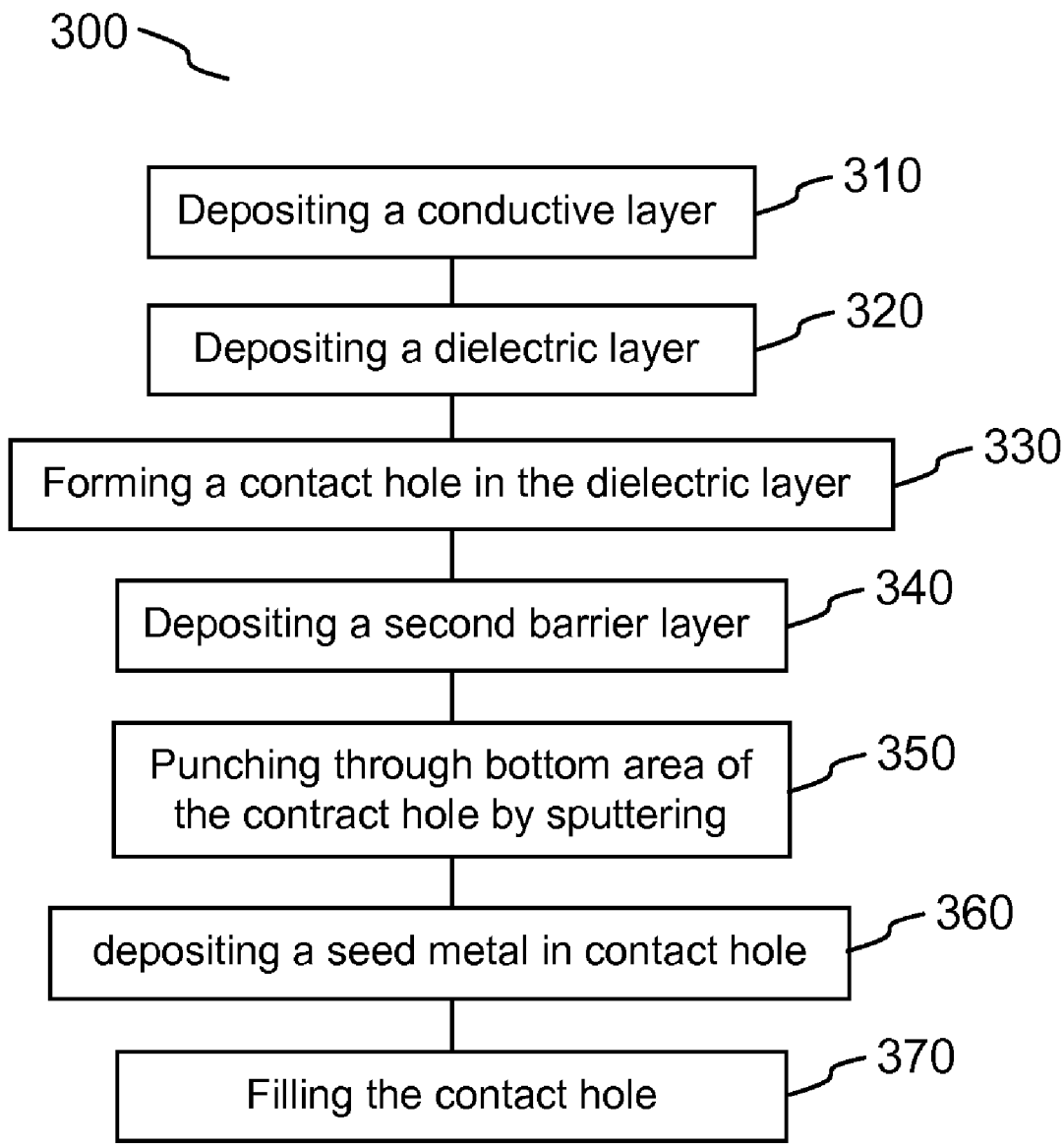
FIG. 3 is a flowchart illustrating subsequent process steps for forming the source/drain contact according to the embodiments of the present invention.

FIG. 3 is a flowchart 300 illustrating process steps subsequent to either flowchart 200 or 250 for forming the source/drain contact according to the embodiments of the present invention. After the silicide and barrier layers are formed on the source/drain region, a conductive layer may be deposited on the barrier layer in step 310. According to both the first and second embodiments of the present invention, where the barrier layer is made of either electroless plated CoWP, CoWB or Ta/TaN, or epitaxy grown Co or CoSi, the conductive layer may be formed by selective electroless plating of Cu on the barrier layer. According to the third embodiment of the present invention, where the barrier layer is formed by atomic layer deposition of a material such as Ru, the conductive layer may be formed by either electroless plating or atomic layer deposition of Cu. According to the fourth embodiment of the present invention shown in FIG. 2B, the conductive layer may be formed by electroless plating, atomic layer deposition or epitaxy growth of a metal, such as Cu. But according to the first embodiment of the present invention, where the barrier layer is formed by electroless plating of CoWP, CoWB, Ag, Ru or Fe, the conductive layer deposition step 215 may be skipped altogether.

Referring again to FIG. 3, a dielectric layer serving as inter-metal-dielectric is deposited on the conductive layer or the barrier layer directly in step 320. Afterwards, a contact hole is etched in the dielectric layer in step 330.

With continuous reference to FIG. 3, a second barrier layer is deposited on the side walls and bottom of the contact hole in step 340. The second barrier layer is often made of Ta/TaN. Then a sputtering step 350 punches through or exposes the bottom area of the contact hole. After step 350, a Cu seed layer is deposited in step 360. On top of the Cu seed layer, more Cu is deposited to fill up the contact hole in step 370. Then a contact to the source/drain region is formed.

Figure 4A:
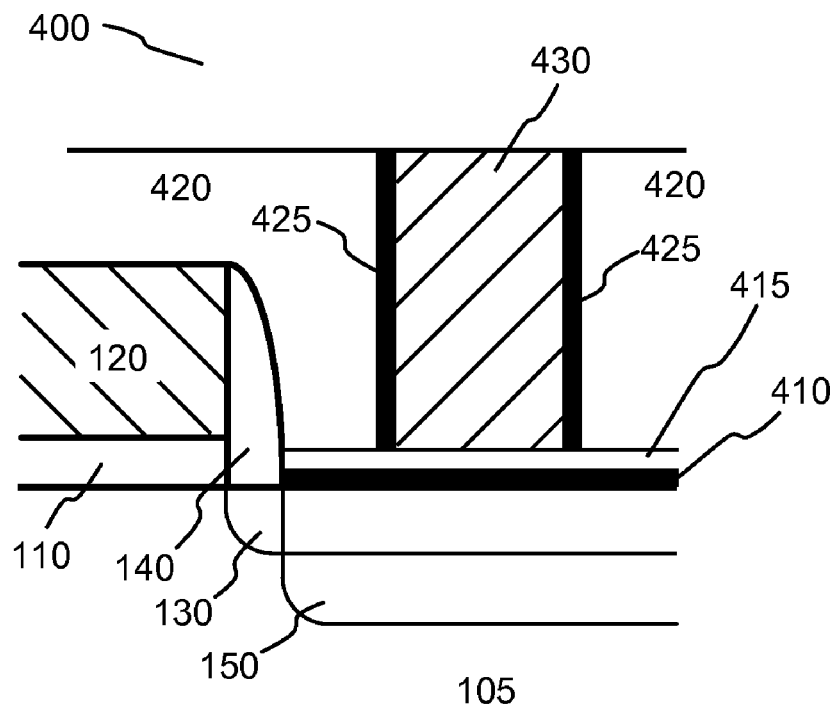
FIGS. 4A and 4B are cross-sectional views of contact structures formed by the processing steps described by the flowcharts of FIGS. 2A, 2B and 3.
Figure 4B:
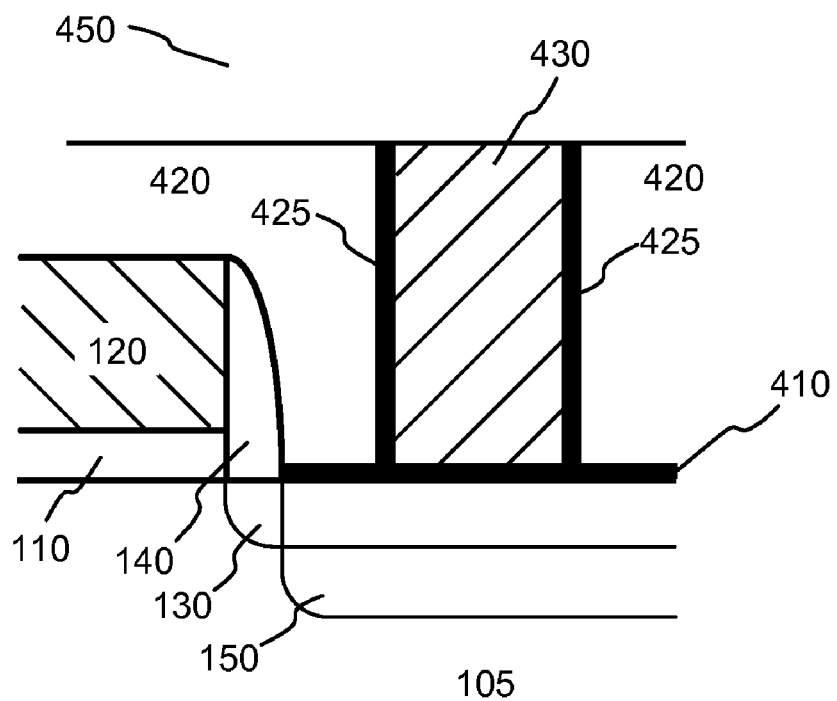

FIGS. 4A and 4B are cross-sectional views of contact structures 400 and 450 formed by the process steps described by the flowchart 200 of FIG. 2A or flowchart 250 of FIG. 2B and the flowchart 300 of FIG. 3. Referring to FIG. 4A, a first barrier layer 410 is deposited on the source/drain region 150 by step 210 of FIG. 2A or steps 260 and 265 of FIG. 2B. A conductive layer 415 is deposited on the barrier layer 410 by step 310 of FIG. 3. An inter-metal-dielectric layer 420 is deposited thereafter by step 320 of FIG. 3. A contact hole is then etched through the inter-metal-dielectric layer 420 by step 330 of FIG. 3. Then a second barrier layer 425 is deposited on the sidewalls and bottom of the contact hole by step 340 of FIG. 3. Before filling up the contact hole with a metal 430 by step 370 of FIG. 3, the second barrier layer 425 on the bottom of the contact hole is removed by the sputtering step 350 of FIG. 3, to allow the filling metal 430 to directly contact the conductive layer 415. For reducing contact resistance, Cu is typically chosen as the filling metal 430.

Referring to FIG. 4B, the only difference between FIG. 4B and FIG. 4A is that the conductive layer 415 of FIG. 4A is eliminated in FIG. 4B, and the filling metal 430 contacts the first barrier layer 410 directly.

Referring again to both FIGS. 4A and 4B, even though the first barrier layer 410, which typically has higher resistance, is still present, it has a large contact area with the underlying source/drain region. In a typical process, the first barrier layer 410 covers the entire source/drain region 150. As a result of the large contact area, the R3 of EQ. 1 may be greatly reduced, and so are the overall contact resistance Rc of the contact structure 400 or 450.

Although specific materials, such as Cu for filling metal, etc., are used to describe the embodiments of the present invention, one having skill in the art would realize that the inventive essence of the present invention lies in the process sequence of forming the first barrier layer 410, which results in the increased contact area between the first barrier layer 410 and the source/drain region 150, which in turn causes the total contact resistance Rc to decrease. Therefore, other metals, such as aluminum may also be used in various steps of the embodiments of the present invention.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device comprising: a substrate; a source/drain region disposed in the substrate; at least one non-silicided conductive layer comprising a first barrier layer disposed over and in direct contact with the source/drain region; one or more contact holes formed over the non-silicided conductive layer; and one or more contact hole filling metals comprising a second barrier layer and a filling conductive layer disposed over and directly contacting the at least one non-silicided conductive layer, and wherein a first contact area between the at least one non-silicided conductive layer and the source/drain region is substantially larger than a second contact area between the one or more contact hole filling metals and the at least one non-silicided conductive layer.

2. The semiconductor device of claim 1, wherein the source/drain region comprises a surface silicided layer.

3. The semiconductor device of claim 1, wherein the first barrier layer comprises a material selected from the group consisting of Ti, TiN, Ta, TaN, Ru and Co.

4. The semiconductor device of claim 3, wherein the at least one non-silicided conductive layer further comprises a first conductive layer deposited over and in contact with the barrier layer.

5. The semiconductor device of claim 4, wherein the first conductive layer comprises Cu.

6. The semiconductor device of claim 4, wherein the first conductive layer comprises a material selected from the group consisting of Au, Ag, Si, C, Fe, Co, Ti, Pt and a combination thereof.

7. The semiconductor device of claim 1, wherein the filling conductive layer of the one or more contact hole filling metals comprises Cu.

8. The semiconductor device of claim 1 further comprises a dielectric layer disposed over the at least one non-silicided conductive layer and surrounding the one or more contact hole filling metals.

9. A semiconductor device comprising: a substrate; a source/drain region disposed in the substrate; at least one barrier layer disposed over and in direct contact with the source/drain region; one or more contact holes formed over the at least one barrier layer; and one or more contact hole filling metals comprising another barrier layer and a filling conductive layer disposed over and directly contacting the at least one barrier layer, and wherein a first contact area between the at least one barrier layer and the source/drain region is substantially larger than a second contact area between the one or more contact hole filling metals and the at least one barrier layer.

10. The semiconductor device of claim 9, wherein the source/drain region comprises a surface silicided layer.

11. The semiconductor device of claim 9, wherein the at least one barrier layer comprises a material selected from the group consisting of Ti, TiN, Ta, TaN, Ru and Co.

12. The semiconductor device of claim 9, wherein the at least one barrier layer comprises:
 a first conductive layer in contact with the source/drain region and comprising a material selected from the group consisting of Ti, TiN, Ta, TaN, Ru and Co; and
 a second conductive layer disposed over the first conductive layer and comprising a material selected from the group consisting of Cu, Au, Ag, Si, C, Fe, Co, Ti, Pt and a combination thereof.

13. The semiconductor device of claim 9, wherein the filling conductive layer of the one or more contact hole filling metals comprises Cu.

14. The semiconductor device of claim 9 further comprises a dielectric layer disposed over the at least one non-silicided conductive layer and surrounding the one or more contact hole filling metals.

* * * * *